United States Patent
Müller et al.

(10) Patent No.: US 12,356,574 B2
(45) Date of Patent: Jul. 8, 2025

(54) EXPLOSION-PROOF HOUSING FOR A POWER ELECTRONICS DEVICE

(71) Applicant: SMA Solar Technology AG, Niestetal (DE)

(72) Inventors: Steffen Müller, Kassel (DE); Waissi Tello, Kassel (DE)

(73) Assignee: SMA Solar Technology AG, Niestetal (DE)

( * ) Notice: Subject to any disclaimer, the term of this patent is extended or adjusted under 35 U.S.C. 154(b) by 143 days.

(21) Appl. No.: 18/160,422

(22) Filed: Jan. 27, 2023

(65) Prior Publication Data

US 2023/0171912 A1 Jun. 1, 2023

Related U.S. Application Data

(63) Continuation of application No. PCT/EP2021/070851, filed on Jul. 26, 2021.

(30) Foreign Application Priority Data

Jul. 27, 2020 (DE) ...................... 10 2020 119 779.9

(51) Int. Cl.
*H05K 7/14* (2006.01)
(52) U.S. Cl.
CPC .................... *H05K 7/1432* (2013.01)
(58) Field of Classification Search
CPC ................ H05K 7/1432; H05K 7/14
(Continued)

(56) References Cited

U.S. PATENT DOCUMENTS

| 3,638,364 A | 2/1972 | Grove et al. |
| 5,191,991 A | 3/1993 | Jackson |

(Continued)

FOREIGN PATENT DOCUMENTS

| BR | MU8800357 U2 * | 5/2009 | ............... H01B 7/17 |
| CN | 104835929 A | 8/2015 | |

(Continued)

OTHER PUBLICATIONS

International Search Report dated Oct. 14, 2021 in connection with PCT/EP2021/070851.

*Primary Examiner* — Timothy J Thompson
*Assistant Examiner* — Guillermo J Egoavil
(74) *Attorney, Agent, or Firm* — Eschweiler & Potashnik, LLC

(57) ABSTRACT

The disclosure relates to a housing for a power electronics device, including a tray for receiving power electronics components and a cover for placing on the tray so that a closed housing is formed. The cover is fixed on the tray by a plurality of fixing screws. At least one opening element is provided that is made of one of the fixing screws, each of which is guided through a sleeve with deformation structures. The sleeve is arranged between the screw head of the fixing screw and the housing such that a pressing force is exerted by the screw head between the cover and the tray via the sleeve. The deformation structures are designed such that under the effect of the force of an explosion that exceeds the pressing force, the sleeve is compressed in a manner defined by the deformation structures such that a gap with a specified width is formed between the cover and the tray.

16 Claims, 8 Drawing Sheets

(58) Field of Classification Search
USPC .......................................................... 361/807
See application file for complete search history.

(56) References Cited

U.S. PATENT DOCUMENTS

| | | | |
|---|---|---|---|
| 10,215,215 B2 | 2/2019 | Zylberstein et al. | |
| 2008/0247100 A1* | 10/2008 | Fasano ................. | H01H 83/226 |
| | | | 361/45 |
| 2017/0181298 A1 | 6/2017 | Ahrens et al. | |
| 2018/0045239 A1* | 2/2018 | Zylberstein ............. | F16B 31/02 |
| 2018/0340447 A1 | 11/2018 | Karafillis et al. | |
| 2019/0128358 A1* | 5/2019 | Stanescu ................... | F16F 7/12 |

FOREIGN PATENT DOCUMENTS

| | | |
|---|---|---|
| CN | 207555070 U | 6/2018 |
| DE | 202014100486 U1 | 5/2015 |
| DE | 202015106657 U1 | 3/2017 |
| GB | 391829 A | 5/1933 |

* cited by examiner

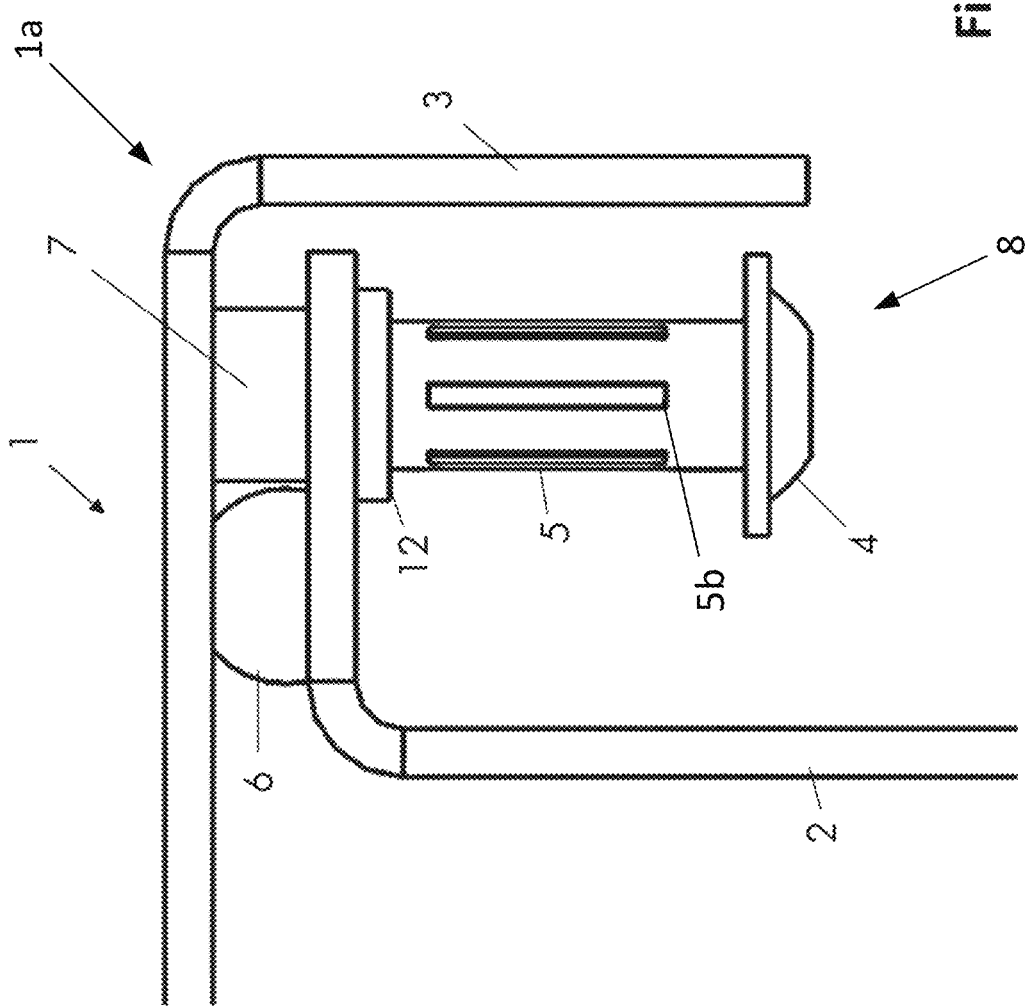

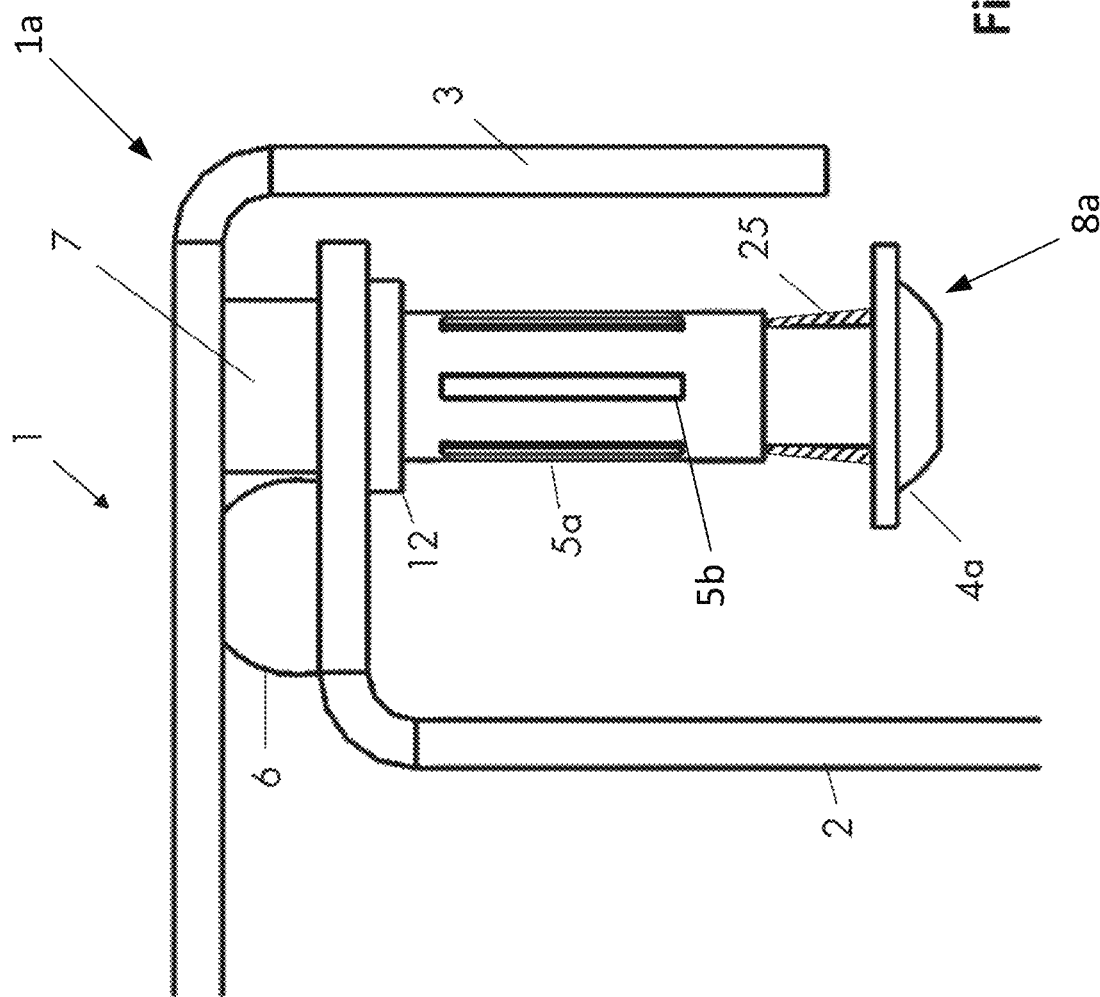

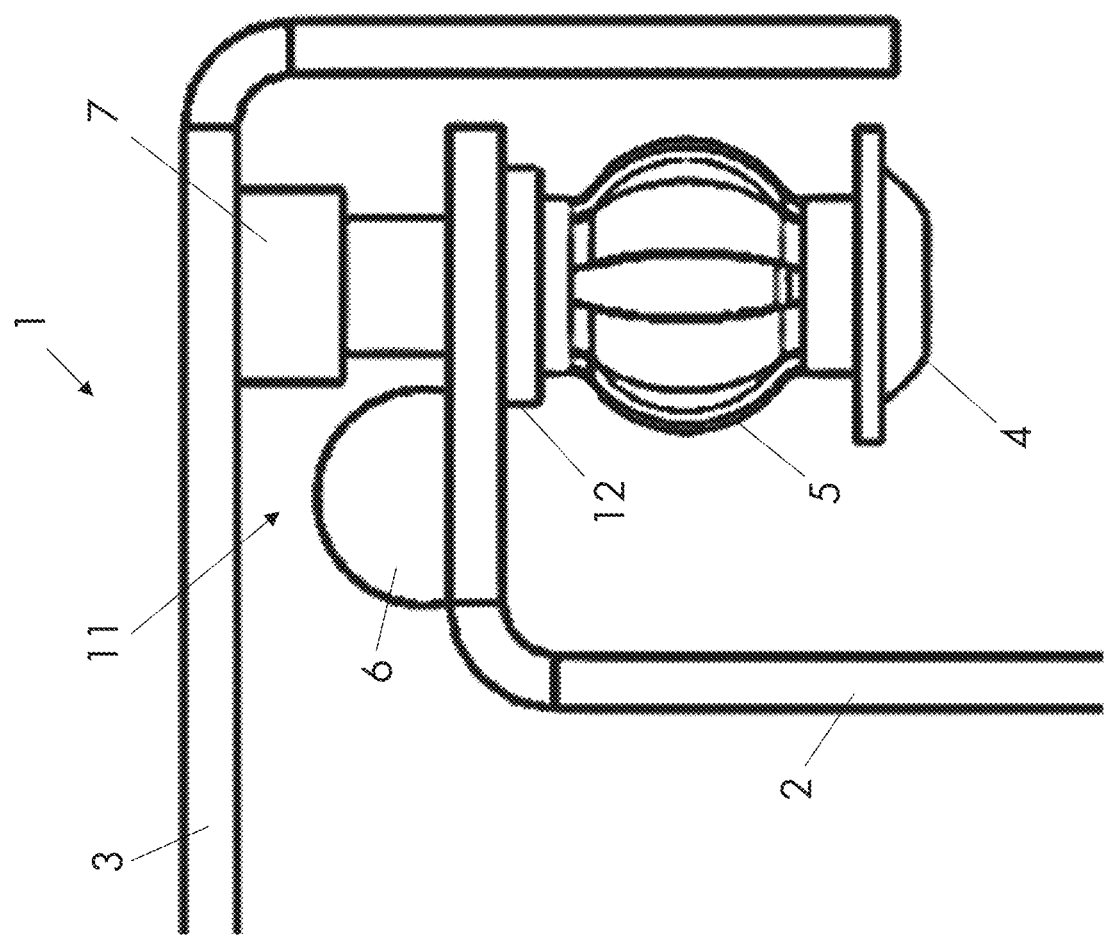

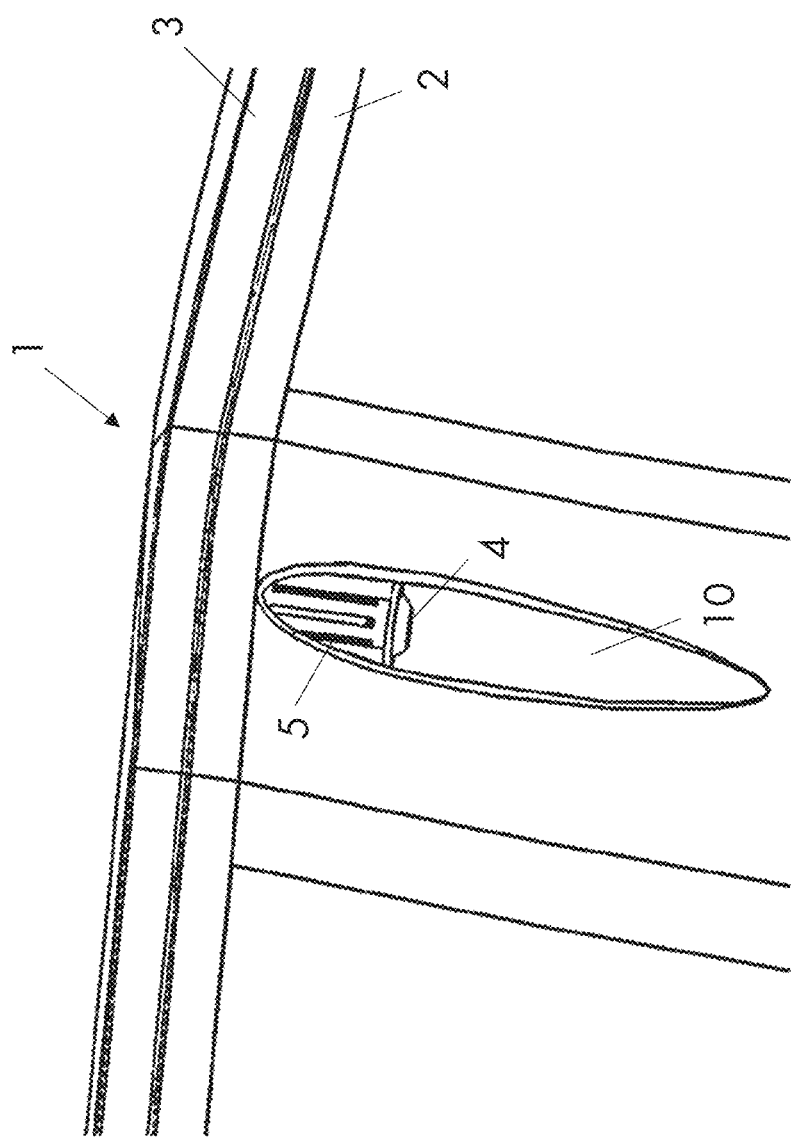

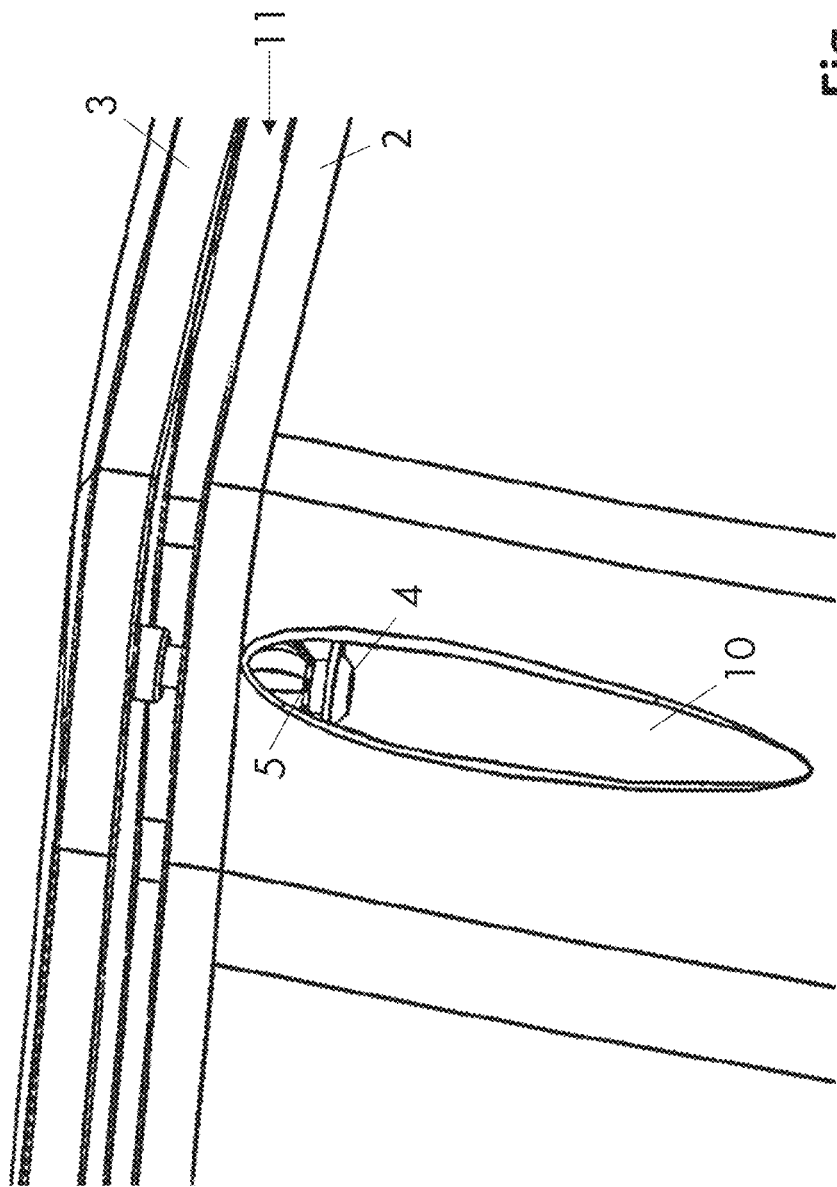

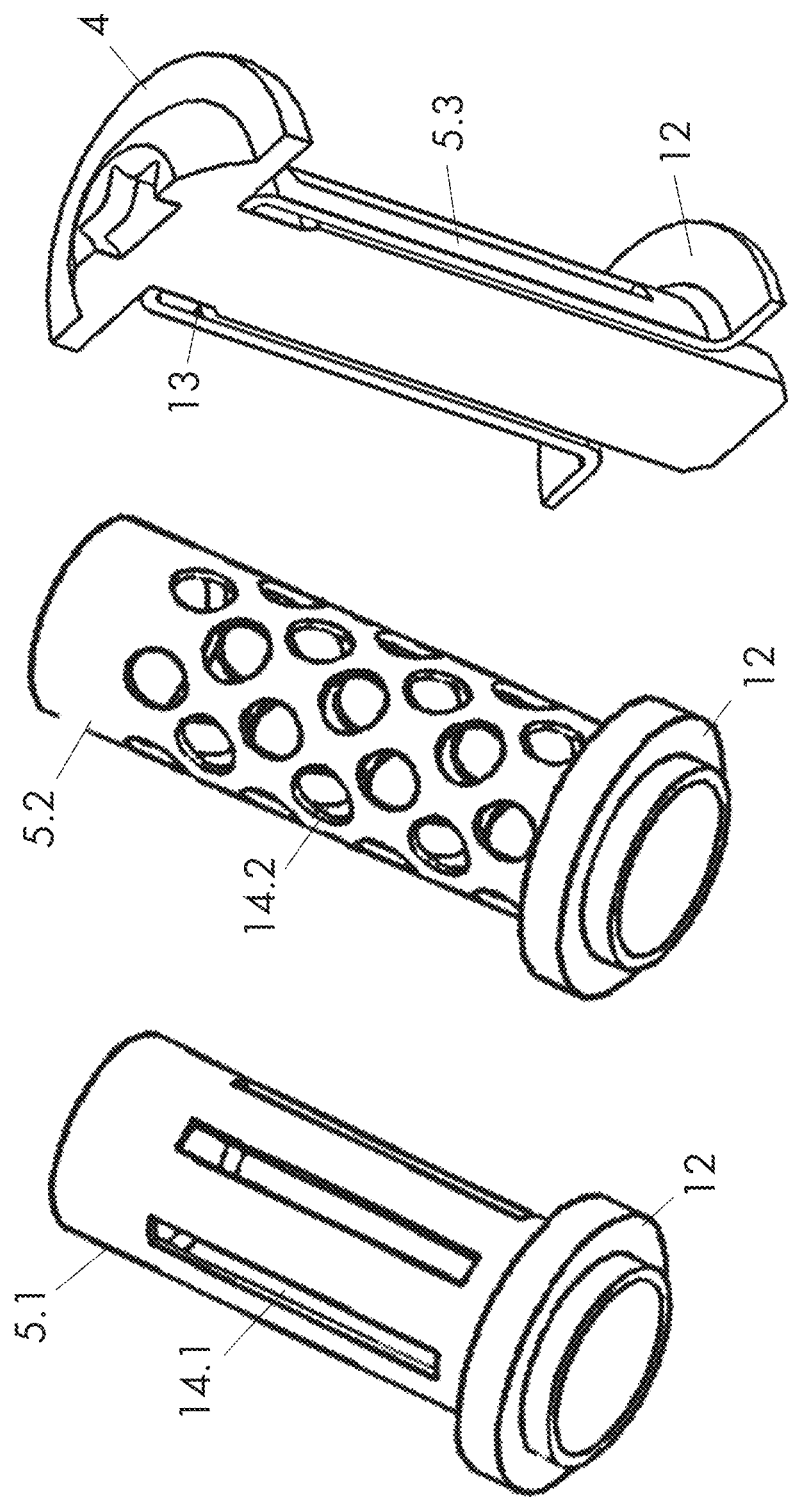

EXPLOSION-PROOF HOUSING FOR A POWER ELECTRONICS DEVICE

CROSS REFERENCE TO RELATED APPLICATIONS

This application is a continuation of International Patent Application Number PCT/EP2021/070851, filed on Jul. 26, 2021, which claims priority to German Patent Application number 10 2020 119 779.9, filed on Jul. 27, 2020, and is hereby incorporated by reference in its entirety.

FIELD

The disclosure relates to a housing for a power electronics device. In this case, a cover of the housing is fastened in such a way that the cover is reliably held on the rest of the housing body in the event of an explosion inside the housing.

BACKGROUND

In power electronics devices, for example, inverters for the conversion of input power provided as direct current into output power provided as alternating current, a possible explosion of components, for example, capacitors or circuit breaker modules, may occur inside housings of these devices, the possible explosion pressure of which increases with the continuously increasing power density due to technological advancement. Since currently there are insufficient safety regulations for the design of housings for such devices, incidents have already been reported in which people who were in the vicinity of the device were injured by flying housing parts that became detached as a result of an explosion.

For this reason, solutions exist for forming housings in such a way that no housing parts come loose even in the event of an explosion. In order to avoid having to produce unnecessarily stable and thus material-intensive housing forms, it appears advantageous to design housings in such a way that, in the event of an explosion, a cover as a first housing component is able to detach in a controlled manner from a tray as a second housing component, forming an outlet gap, so that the explosion pressure can escape through the outlet gap.

For this purpose, the document DE 20 2014 100 486 A1 proposes to connect the cover and the tray via a deformable fastening element which has a closed ring, wherein the fastening element is screwed to the cover and the housing on opposite portions in each case. However, such a fastening element requires considerable installation space and is therefore only suitable for selected applications.

Alternatively, it is proposed in DE 20 2015 106 657 U1 to surround a housing body or a housing cover at their fastening points with a recess in such a way that a gap is formed between the housing body and housing cover when an internal pressure in the housing exceeds a predetermined limit value. Such a housing design is also limited to selected applications and is particularly suitable for housing parts formed from sheet metal by cold forming.

SUMMARY

Frequently, however, there is also a desire to modify an existing type of housing cover with the least possible redesign and manufacturing effort so that complete detachment of the housing cover in the event of an explosion inside the housing with a given explosion load acting on the cover is avoided.

The present disclosure addresses the problem of providing a housing cover which can be produced inexpensively and with little design effort, and which remains reliably attached to the housing in the event of an explosion.

In a first embodiment, the disclosure relates to a housing for a power electronics device. The housing comprises a tray configured to receive power electronics components and a cover configured to fit on the tray so that a closed housing is formed. The cover is fixed on the tray by a plurality of fixing screws. At least one opening element is provided that is formed by one of the fixing screws, and each of the fixing screws is guided through a sleeve with deformation structures, said sleeve being arranged between the screw head of the fixing screw and the housing such that a pressing force is exerted by the screw head between the cover and the tray via the sleeve. In terms of material, material thickness, and shaping, the sleeve is formed in such a way that the pressing force exerted to fix the cover on the tray does not lead to any significant deformation of the sleeve in this case. The deformation structures of the sleeve are formed such that, under the effect of an explosion force exceeding the pressing force, the explosion being triggered, for example, by an explosion of power electronics components, as a result of which an excess pressure is formed in the interior of the housing, the sleeve is compressed in a manner defined by the deformation structures such that a gap of predefined width is formed between the cover and the tray.

In one embodiment, the screw heads of the fixing screws are arranged on the side of the tray opposite the cover. In one embodiment, the fixing screw engages with the thread in a mating thread of the cover. The mating thread can be formed as a blind thread so that the screw connection is not visible on a side of the cover facing away from the tray. The blind thread can be cut directly into the material of the cover, or it can be attached to the cover on the tray side as a threaded sleeve, for example, by being pressed in.

The formation of the gap allows the excess pressure to escape from the interior of the housing, wherein the cover remains fixed to the tray. The compression of the sleeve at the moment of the effect of the explosion force relieves the connection between the fixing screw and the mating thread even before the explosion-induced excess pressure escapes, in order to counteract the risk of the tray and cover becoming detached from each other due to the fixing screw being torn out of the mating thread. The deformation structures introduced into the sleeve represent a deliberate weakening of the mechanical stability of the sleeve, so that the sleeve has sufficient mechanical stability to provide the pressing force within the scope of a correct assembly of the cover on the tray without any significant deformation of the sleeve. Under the action of the substantially higher explosive force, however, compressive deformation of the sleeve occurs in a manner determined by the design of the deformation structures, wherein the compression forces required for the deformation are adjustable by the design of the deformation structures.

In one embodiment of the disclosure, at least one additional braking element is provided on the housing. This additional braking element comprises a screw and a further sleeve with deformation structures, wherein the screw is guided through the further sleeve. In this case, the further sleeve is arranged between the screw head of the screw of the braking element and the housing in such a way that the further sleeve is compressed in a manner defined by the deformation structures only when the gap between the cover and the tray reaches a predefined minimum width.

In one embodiment, two main functions are realized for a housing of a power electronics device comprising a housing tray and a housing cover. On the one hand, sufficient tightness must be ensured and, on the other hand, explosion protection must be ensured in the event of damage. For tightness, it is therefore advantageous to have the highest possible pressing force of the cover on the tray, which is provided by the fixing screws. For explosion protection, on the other hand, it is advantageous that the opening elements formed by the fixing screws with the deformable sleeves open at the earliest possible point in time, i.e. at the lowest possible explosion pressure in the interior of the housing, and release a gap. Depending on the design of the power electronics device, however, such high explosion pressures can also occur in a short time such that the energy absorption capacity of the sleeves of the opening elements through compression is no longer sufficient to absorb enough explosion energy before the destruction threshold is reached and the fixing screws are torn out of the threads, for example. However, in some instances it is may be technically impossible or difficult to increase the dimensions of the opening sleeves, for example, because of the limited installation space. For example, the sleeve length cannot be increased at will. Although this would result in a greater compression path for the sleeves and thus greater energy absorption capacity, the opening gap may then become too large, so that destroyed but still live parts are exposed, for example.

In one embodiment, by providing additional braking elements, the braking and absorption function is basically separated from the pressing and opening function. Also in this embodiment, the pressing force is provided by the fixing screws of the opening elements. Similarly, the sleeves of the opening elements allow a gap to be formed between the cover and the tray. Only when a gap has already formed does the energy absorption effect of the additional braking elements kick in, so that the housing can withstand significantly greater explosion pressures without reaching the destruction threshold. The screws and sleeves of the braking elements are formed and arranged here in such a way that the additional absorption capability only kicks in once the gap has reached a predefined minimum width. In this way, fast gap formation can be combined with high energy absorption as required.

In one embodiment, the screw heads of the additional braking elements, similarly to the fixing screws of the opening elements, are arranged on the side of the tray opposite the cover and in one embodiment engage with their threads in the same type of mating threads of the cover as the fixing screws. For example, this ensures versatility of the explosion protection and opens up the possibility of adapting the number and shape of additional braking elements to the requirements of the housing. Further, the arrangement of additional braking elements in existing threads of the housing makes it possible to retrofit optimized explosion protection in existing equipment.

In a further embodiment, the screw head and the sleeve of the additional braking element are arranged at a distance from one another. This distance is selected as a function of the predefined minimum width. The additional braking elements thus contribute their additional energy absorption capacity only when the gap has formed in accordance with the minimum width. The screw head then contacts the initial region of the additional sleeve and a force transfer from the screw head to the sleeve begins. With further opening of the gap, due to the internal explosion pressure which has not yet been relieved, the sleeve is compressed and absorbs additional energy through controlled mechanical deformation.

It is also conceivable that the screw of the additional braking element has a thread extending over the entire screw shank. With increasing compression of the sleeve, this design results in an increased absorption effect due to the interlocking of sleeve and thread. In one embodiment, the sleeve of the additional braking element has an approximately linear force curve. In detail, this means that the sleeve of the additional braking element opposes an increasing force F to an increasing compression by an offset d, i.e., as the gap opening increases. This can be ensured by the sleeve having differently ductile areas that can be compressed with different forces.

In one embodiment of the disclosure, the fixing screws and, optionally, the screws of the additional braking elements are each arranged in a guide channel of the tray. This allows, on the one hand, the screw heads to be guided during screwing and to be concealed in favor of a uniform appearance of the housing. On the other hand, the guide channel can be used specifically to shape the course of the deformation counterforces provided by the sleeve during compression. This can be achieved by selecting the cross-section of the channel in the region of the sleeve in such a way that the deformed sleeve contacts the side walls of the guide channel during the course of compression. After contacting the side walls, the sleeve can provide an increased counterforce against further deformation, thereby delaying complete compression of the sleeve. As a result, the sleeve can successfully absorb higher explosion forces without causing the screw to tear out of the mating thread.

In a further embodiment, the sleeve is pre-formed in such a way that it is retained against loss when it is fitted onto a shank of the screw. This can be achieved by providing the sleeve on the side facing the screw head with a collar directed towards the interior of the sleeve, the collar engaging in a tapered region of the screw shank. It is also conceivable to pre-form the sleeve in such a way that it has a region with a tapered inner diameter in which it presses resiliently against the thread after being fitted onto the screw.

Alternatively or additionally, the screw may have a centering element arranged in such a way that the sleeve is pressed against the screw head in a centered position relative to the screw. The centering element can be arranged as a conically shaped attachment directly on the head of the particular screw and can be made of plastic, for example. This makes the compression process more reproducible, because tilting of the sleeve is avoided. Such a centering element can be provided both for the fixing screws and for at least one of the screws of the additional braking elements.

Alternatively, the housing can be designed to fix the sleeve to the tray before screwing. For this purpose, the tray can have corresponding retaining structures for the sleeve. It is also conceivable to form the sleeve as a press-fit sleeve which is pressed into a suitable recess in the tray before the housing is screwed on and thus fixed.

Furthermore, it is conceivable that the tray has a shaping structure on which the sleeve is fitted and which is designed to determine the deformation of the sleeve under the action of the explosion force. For example, the shaping structure may have a conical region that results in radial expansion or compression of the sleeve under the action of the explosion force. In this way, the force required to cause deformation of the sleeve can be reduced to a suitable value. Shaping structures acting in this way can also be arranged alternatively or additionally on the screw head.

In one embodiment, the deformation structures can be formed as slots. The slots can run longitudinally in a central region of the sleeve so that webs remain between the slots and deform outwards under the action of the explosion force. In one embodiment, at least three slots are provided so that at least three webs are formed. However, it is also conceivable to provide more than three slots. It is also conceivable to provide slots that have an angled course instead of longitudinal ones. Such a design results in a torsional component during compression of the sleeve.

Instead of slots, the deformation structures can also have a different shaping and arrangement relative to one another, resulting in a desired compression of the sleeve. For example, it is conceivable to provide a plurality of holes in the sleeve. A sleeve with varying ductility over its course could then be formed in such a way that holes of different sizes or hole spacings are provided in different regions of the sleeve, thus leaving more or less material between the holes to be compressed. The deformation structures may be formed by removing sleeve material regardless of their arrangement or shape. A removal to form the deformation structures can be carried out by laser cutting, but also by other previously known methods.

However, in one embodiment it is also conceivable to design the deformation structures as embossing structures. The deformation structures are then embossed by a suitable embossing die without removing sleeve material.

In a further embodiment, opening elements with fixing screws and sleeves and braking elements with screws and further sleeves are provided in alternating sequence to fix and secure the cover on the tray. It is particularly advantageous that, in the case of a housing with a rectangular basic shape, the opening elements are arranged centrally on the longitudinal sides and the additional braking elements are arranged in the corner regions. It has been found that such an arrangement, in view of a local uneven distribution of the internal explosion pressure, especially at the beginning of an explosion, when usually only individual power electronics components explode, allows sufficient distribution of the explosion force. In particular, in conjunction with sleeves of different ductility in different regions, asymmetric gap formation can be counteracted.

BRIEF DESCRIPTION OF THE FIGURES

In the following, the disclosure is illustrated with the aid of figures, in which:

FIG. 1a shows a first cross section of an opening element of a housing according to the disclosure in the region of a screw connection, FIG. 1b shows a first cross-section of a braking element of a housing according to the disclosure in the region of a screw connection, FIG. 2a shows a second cross-section of an opening element of a housing according to the disclosure in the region of a screw connection after an explosion in the interior of the housing, FIG. 3 shows a first view of a screw connection region of a housing according to the disclosure, FIG. 4 shows a second view of a screw connection region of a housing according to the disclosure in the region of a screw connection after an explosion in the interior of the housing, FIG. 5 shows three embodiments of a deformable sleeve for use with a housing screw connection.

DETAILED DESCRIPTION

Figure 2B:
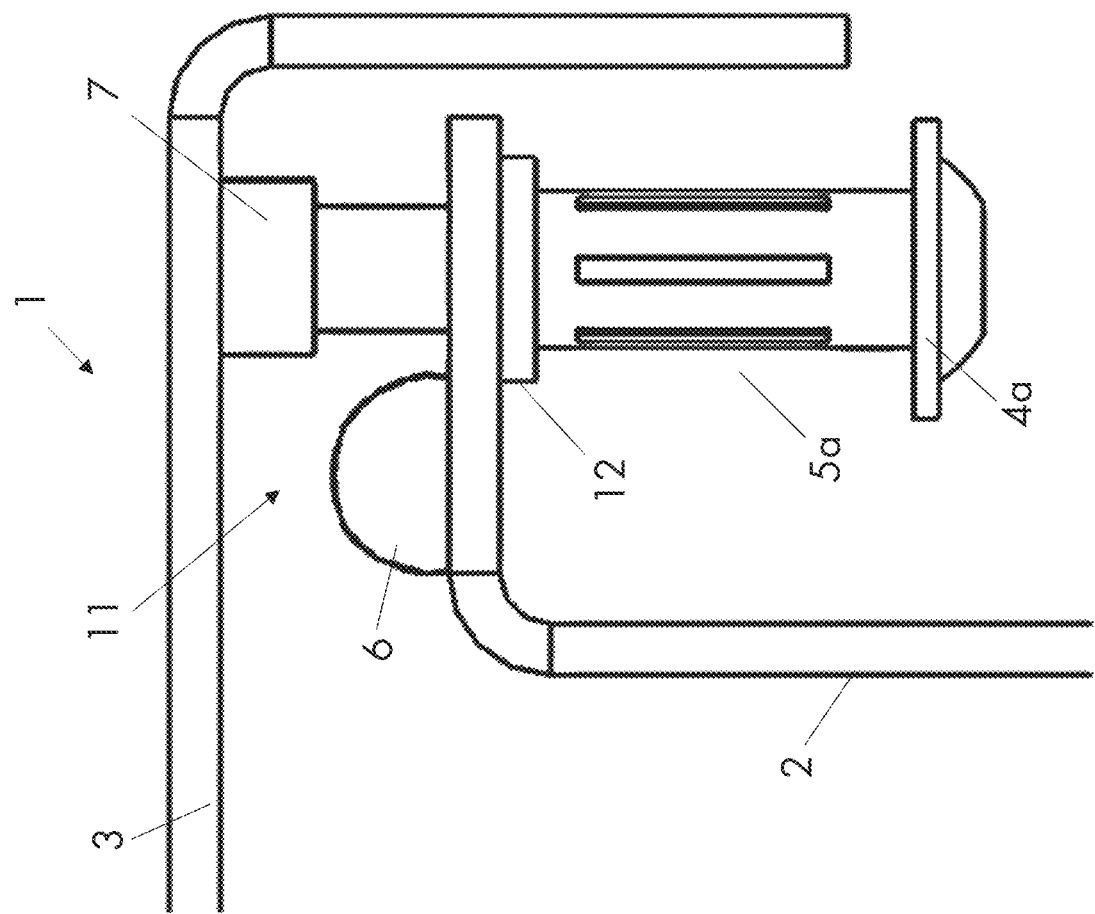
FIG. 2b shows a second cross-section of a braking element of a housing according to the disclosure in the region of a screw connection after an explosion in the interior of the housing.

FIG. 1a shows a cross-section through an opening element 1a of a housing 1 of a power electronics device, for example, an inverter, in the region of a screw connection. A cover 3 of the housing is fixed on a tray 2 of the housing by means of a fixing screw 4 and pressed against a seal 6 arranged between cover 3 and tray 2. The pressing force is exerted by means of the fixing screw 4, which engages in a thread 7 of the cover 3. Between a head of the fixing screw 4 and the tray 2 there is arranged a sleeve 5, which was fitted on the screw thread before screwing, so that the pressing force is exerted on the tray 2 by the screw head of the fixing screw 4 via the sleeve 5. In this state, the sleeve 5 largely retains its initial form before screwing. In this case, the sleeve 5 has a collar 12 on the side facing the tray 2. The combination of the fixing screw 4, the sleeve 5, the collar 12 and the thread 7 are, in one embodiment, a braking element 8. The housing 1 has a single one or a plurality of such screw connections serving as respective opening elements, for example, at each of the housing corners or centrally on the longitudinal sides of the housing 1.

In the state shown in FIG. 1a, the interior of the housing 1 is completely sealed from the external environment, and the power electronics device is ready for operation.

FIG. 1b shows a cross-section through a housing 1 of a power electronics device in the region of a screw connection in which an additional braking element 8a is arranged. The housing is in the same sealed state here as in FIG. 1a. A screw 4a of the braking element 8a engages through an opening of the tray 2 in a thread 7 of the cover 3 of the housing 1. However, the fixing of the cover 3 on the tray 2 and the sealing, by the seal 6 arranged between the cover 3 and the tray 2, is not provided via the screw 4a of the braking element 8a, but by one or more fixing screws 4 on other screw connections of the cover, as described in FIG. 1a.

A further sleeve 5a of the braking element is arranged between a head of the screw 4a and the tray 2 and is fitted on the screw thread before screwing. The screw head of the screw 4a and the sleeve 5a are arranged at a distance from each other so that no pressing force is exerted on the tray 2 by the screw head of the screw 4a via the sleeve 5a. In this embodiment, the distance between the screw head of the screw 4a and the sleeve 5a determines the minimum width of a gap 11 (see FIGS. 2a-2b) which must have opened in the event of an explosion before the energy absorption of the braking element by the compression of the sleeve 5a starts to take effect. A centering element 25 is arranged on the screw head, the function of which is to bring the sleeve 5a into a centered position relative to the screw 4a in the course of compression, so that tilting of the sleeve is precluded. This makes the compression process more reproducible. Such a fixing element can also be arranged on the head of the screw 4 of FIG. 1a.

The sleeve 5a also has a collar 12 on the side facing the tray 2. In the embodiment shown, the collar 12 serves to retain the sleeve 5a on the tray 2, just as in the case of the sleeve 5 of the opening element, for example, by being pressed into a receptacle in the tray 2. The housing 1 may have a plurality of such screw connections serving as braking elements.

If, as shown in FIGS. 2a and 2b, an explosion now occurs in the interior of the housing, for example, due to an overload of power electronics components located there, an excess pressure develops in the interior of the housing and is transmitted to the fixing screws 4 and the sleeves 5 of the opening elements arranged between the tray 2 and the screw head. As a result, such a high force is exerted on the sleeves 5 that they are deformed by compression and partially collapse, reducing the distance between the screw head and the tray 2. This forms a gap 11 between the tray 2 and the cover 3 through which the excess pressure can escape from the inside of the housing. This immediately leads to a reduction in the force acting on the fixing screws 4, so that the sleeves 5 only partially collapse and the connection between fixing screw 4 and cover 3 is maintained and the cover 3 continues to be held on the tray 2. When the gap 11 has opened by the minimum width defined by the distance between the screw head of the screw 4a and the sleeve 5a of the braking element, the screw head of the screw 4a has overcome the distance to the sleeve 5a and additionally begins to transmit a force to the sleeves 5a of the braking elements. The sleeves 5a are now also compressed, resulting in an improved reduction of the force acting on the fixing screws 4. This improves the ability of the housing to withstand also higher explosion pressures.

The width of the gap 11 that forms can be specified by the design of the sleeves 5 and 5a in such a way that it is not possible to reach into the interior of the housing even after the explosion. This leads to an increase in device safety, since dangerous voltages may be present in the interior of the housing 1 even after an explosion, so that protection against contact must be ensured. The design of the sleeves 5 and 5a of the opening elements and the braking elements can concern the number, the dimensions, the choice of material and the shaping of the sleeves 5, 5a. The shaping in this case can, for example, also comprise a provision of deformation structures 5b on the sleeve. For example, it is conceivable to provide holes or slots by means of subtractive methods, or to vary the local thickness of the sleeves by embossing. The deformation structures 5b serve to define a threshold force above which the sleeve collapses under compression force, and to influence the deformation of the sleeve during collapse. In one embodiment, the threshold force is at least 20% higher, in one embodiment at least 50% higher, than the maximum force acting on the sleeve during screwing of the housing, so that collapse of the sleeve is effectively avoided when the maximum permissible torque is applied to the screws.

FIG. 3 shows a first view of a screwing region of a housing 1 according to one embodiment. Here, the fixing screw 4 is arranged in a guide channel 10, which can visually disguise the fixing screw 4 and provides lateral guidance for the fixing screw 4, for example, the screw head. The screws 4a of the braking elements are also advantageously arranged in such a guide channel 10. In this way, tilting of the screw connection can be counteracted both during the screwing process itself and in the event of an explosion. In FIG. 3, the guide channel 10 is shown in a sectional view, wherein it is not ruled out that the guide channel 10 is designed in the cutaway form shown.

As shown in FIG. 4, in the event of an explosion, the deformation of the sleeve 5 of the opening element forms a gap 11 through which the explosion pressure can escape from the housing 1. In this case, the sleeve 5 can collapse to such an extent that it touches the inner walls of the guide channel 10. This increases the counterforce of the sleeve 5 against further deformation, so that the connection between fixing screw 4 and cover 3 is maintained up to higher explosion forces than without such contact.

FIG. 5 shows some example embodiments of sleeves 5.1 to 5.3 as can be used within the scope of the disclosure. In a first embodiment, the sleeve 5.1 has deformation structures 14.1 in the form of a plurality of slots between which webs remain. When the sleeve 5 collapses, the webs are bent outwardly in the radial direction.

In a second embodiment, the sleeve 5.2 has a deformation structure 14.2 in the form of a distribution of holes over the sleeve surface. A network of webs remains between the holes. The network is compressed under the influence of the explosion force. For example, an embodiment having a distribution of holes may be varied for the sleeves 5a to provide differently ductile regions of the sleeve 5a that allow compression under different force applications. For example, an increasing counterforce of the sleeve with increasing compression of the sleeve can be realized by providing holes with different, for example, decreasing diameters over the course of the sleeve, so that in the case of larger holes, narrower webs are arranged between the holes, which are deformable with lower force application, and in the case of small holes, wider webs are arranged between the holes, which are deformable with higher force application in comparison.

Different compression properties can also be realized by a combination of different types of deformation structures.

In a third embodiment, a loss-proof arrangement of a sleeve 5.3 on a fixing screw 4 is shown in cross-section. An inwardly directed bend of the sleeve engages a taper 13 of the screw shank, so that the sleeve is held against loss on the shank. Such an arrangement leads to a simplified, more reliable assembly of the housing 1. The security against loss can also be achieved in other ways through a suitable shaping of sleeve 5, 5a and/or screw/fixing screw 4, 4a.

Figure 6:
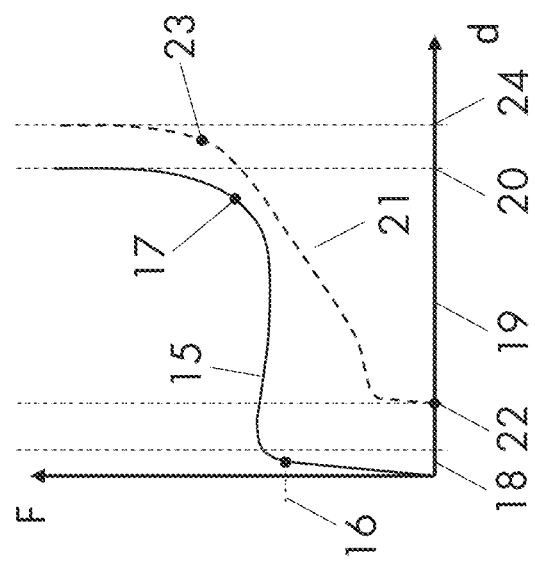
FIG. 6 shows a schematic curve of the formation of a force during a deformation of a sleeve of the opening element and a sleeve of a braking element during an explosion in the interior of the housing.

FIG. 6 shows a curve 15 of a force F which a sleeve 5 used in an opening element of a housing according to the disclosure opposes to a compression through an offset d. In a fixing range 18, which is maintained when the housing is screwed together with a fixing screw 4, the sleeve 5 does not deform or deforms only through an insignificant offset. The torque of the fixing screw 4 used during assembly results in a force F corresponding to a starting point 16 on the curve 15. When an explosive force is applied to the sleeve 5 which considerably exceeds the force F at the starting point 16, the sleeve 5 is transferred to the deformation range 19, the sleeve 5 collapses, and an offset d is formed with simultaneous formation of a gap 11 between the cover 3 and the tray 2 of the housing 1. The gap 11 allows the excess pressure of the explosion to escape, which immediately dissipates the explosion force so that the sleeve 5 is displaced to an end point 17 on the force path 15. The offset d corresponding to the end point 17 is smaller here than an offset d corresponding to a complete collapse 20, which defines the end of the deformation range 19. At the end of the deformation range 19, the associated force F increases steeply, so that there is a risk that the fixing screw 4 will be torn out of the thread of the cover 3 and the cover 3 will detach from the tray 2. The sleeve 5 is in one embodiment formed through the above-described design in such a way that even at the maximum explosive force to be taken into account, the end point 17 is a sufficient distance from this end of the deformation range 19, i.e. the sleeve 5 does not collapse completely and thus the thread 7 is relieved so that the fixing screw 4 cannot tear out of it. Such a design can be provided through means of calculations, for example, using finite element methods, if the pressure curve is known, for example, from preliminary tests. Alternatively or additionally, a design of the sleeve 5 can be determined or optimized through series of experiments with different explosion forces.

In the event that the explosion force to be considered cannot be reduced to a non-critical level through the mode of operation described above, the use of additional braking elements is advantageous. A curve 21 of a force F which a sleeve 5a used in a braking element of a housing according to the invention opposes to a compression through an offset d is also shown in FIG. 6 (dashed curve). In accordance with the invention, compression of the sleeve 5a does not start until the gap 11 has already opened through a minimum width 22. The sleeve 5a is also transferred to its deformation range 19. The force curve 21 is advantageously linear as the gap opening increases, in the sense that as the sleeve 5a is progressively compressed through a further offset d, an increased counterforce is applied. This can be realized through an advantageous design of the deformation structures of the sleeve as described above. In this case, even for the maximum explosion force to be taken into account, the end point 23 of the deformation range 19 should be selected so that the offset d corresponding to the end point 23 is smaller than an offset d corresponding to a complete collapse 24, at which the associated force F increases steeply. For the total counterforce of the cover 3, the counterforces of the sleeves 5 and 5a are summed, so that the housing 1 can withstand higher explosion forces, or the excess pressure generated through explosion of components can be better relieved.

What is claimed is:

1. A housing for a power electronics device, comprising,
a tray configured to receive power electronics components;
a cover configured to fit on the tray to form a closed housing,
wherein the cover is fixed on the tray through a plurality of fixing screws,
at least one opening element formed by a fixing screw of at least one of the plurality of fixing screws,
wherein each at least one opening element is guided via a sleeve with deformation structures, the sleeve being arranged between a screw head of a respective fixing screw and the housing such that a pressing force is exerted through the screw head of the fixing screw between the cover and the tray via the sleeve, wherein the fixing screw and the sleeve comprise a braking element of the opening element,
wherein the deformation structures are configured such that, under an effect of an explosion force exceeding the pressing force, the sleeve is compressed in a manner defined through the deformation structures such that a gap of a predefined width is formed between the cover and the tray,
wherein the tray has a shaping structure on which the sleeve is fitted and which is configured to determine a deformation of the sleeve under an action of the explosion force.

2. The housing as claimed in claim 1, further comprising at least one additional braking element of an additional opening element,
wherein the at least one additional braking element comprises another fixing screw and a further sleeve with deformation structures, wherein the another fixing screw is guided through the further sleeve,
wherein the further sleeve is arranged between the screw head of the another fixing screw and the housing in such a way that the further sleeve is compressible in a manner defined through the deformation structures only from a predefined minimum width of the gap.

3. The housing as claimed in claim 2, wherein the screw head and the sleeve of the additional braking element are arranged at a distance from one another, and wherein this distance is selected as a function of the predefined minimum width.

4. The housing as claimed in claim 2, wherein the fixing screw of the braking element and the another fixing screw of the additional braking element are arranged on a side of the tray opposite the cover.

5. The housing as claimed in claim 4, wherein the fixing screw of the braking element and the another fixing screw of the additional braking element are each screwed into the cover.

6. The housing as claimed in claim 4, wherein the fixing screw of the braking element and the another fixing screw of the additional braking element are each arranged in a guide channel of the tray.

7. The housing as claimed in claim 1, wherein each fixing screw of the plurality of fixing screws is guided in each case through a sleeve with deformation structures.

8. The housing as claimed in claim 1, wherein the sleeves are formed as press-fit sleeves on the tray before screwing.

9. The housing as claimed in claim 1, wherein the deformation structures comprise slots.

10. The housing as claimed in claim 1, wherein the sleeve has at least three longitudinally running slots.

11. The housing as claimed in claim 1, wherein the deformation structures comprise holes.

12. The housing as claimed in claim 1, wherein the deformation structures comprise embossed structures.

13. The housing as claimed in claim 2, wherein the opening element comprises multiple opening elements comprising braking elements, and the additional opening element comprises multiple additional opening elements comprising additional braking elements provided in alternating sequence along a periphery of the housing to fix and secure the cover on the tray.

14. The housing as claimed in claim 13, wherein the housing has a rectangular basic shape, and wherein the opening elements comprising the braking elements are arranged centrally on longitudinal sides thereof, and the additional opening elements comprising the additional braking elements are arranged in corner regions of the housing.

15. The housing as claimed in claim 2, wherein a deformation structure of the sleeve of the additional braking element is configured to be more ductile in a starting region thereof facing the screw head than in a remaining region of the sleeve.

16. The housing as claimed in claim 2, wherein at least one of the plurality of fixing screws comprises a centering element configured to press the sleeve or the further sleeve in a centered manner against the respective screw head.

* * * * *